(12) United States Patent
Liskow

(10) Patent No.: US 10,044,122 B2
(45) Date of Patent: Aug. 7, 2018

(54) ELECTRICAL PLUG-TYPE CONNECTOR AND AN ASSOCIATED ARRANGEMENT COMPRISING A HOUSING

(71) Applicant: Robert Bosch GmbH, Stuttgart (DE)

(72) Inventor: Uwe Liskow, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 354 days.

(21) Appl. No.: 14/366,631

(22) PCT Filed: Nov. 14, 2012

(86) PCT No.: PCT/EP2012/072611
§ 371 (c)(1),
(2) Date: Jun. 18, 2014

(87) PCT Pub. No.: WO2013/092015
PCT Pub. Date: Jun. 27, 2013

(65) Prior Publication Data
US 2015/0004809 A1 Jan. 1, 2015

(30) Foreign Application Priority Data
Dec. 19, 2011 (DE) .................. 10 2011 089 081

(51) Int. Cl.
*H01R 12/00* (2006.01)
*H01R 12/70* (2011.01)
(Continued)

(52) U.S. Cl.
CPC .............. *H01R 12/70* (2013.01); *B60R 16/03* (2013.01); *H01R 12/55* (2013.01);
(Continued)

(58) Field of Classification Search
USPC ........................................................ 439/76.1
See application file for complete search history.

(56) References Cited

U.S. PATENT DOCUMENTS 4,218,724 A * 8/1980 Kaufman .................... 361/736
4,385,791 A * 5/1983 Lovrenich ................... 439/76.1
(Continued)

FOREIGN PATENT DOCUMENTS

CN 102017316 A 4/2011
DE 40 23 319 C1 12/1991
(Continued)

OTHER PUBLICATIONS

International Search Report corresponding to PCT Application No. PCT/EP2012/072611, dated Feb. 4, 2013 (German and English language document) (5 pages).

*Primary Examiner* — Tho D Ta
(74) *Attorney, Agent, or Firm* — Maginot, Moore & Beck LLP

(57) ABSTRACT

An electrical plug-type connector consisting of an electrically nonconductive material includes a plug housing with an inner wall and at least one plug-type contact. The inner wall delimits a first space. The at least one plug-type contact has a first end with which contact can be made by a mating plug-type contact, and a second end, which is opposite the first end. The second end is connected to a printed circuit board by solder. The plug housing is moved from the first end in a direction of the second end via the at least one plug-type contact in the axial direction into a predetermined position. In the predetermined position, the plug-type contact has a lack of force-fitting connection transversely to the axial direction. In the predetermined position, the printed circuit board is fixedly connected to the plug housing. In the predetermined position, the first end protrudes into the first space.

10 Claims, 11 Drawing Sheets

(51) Int. Cl.
  *H01R 12/55* (2011.01)
  *H01R 13/52* (2006.01)
  *B60R 16/03* (2006.01)
  *H01R 43/20* (2006.01)
  *H05K 1/11* (2006.01)
  *H02K 5/22* (2006.01)
  *H01R 12/52* (2011.01)
  *H01R 13/533* (2006.01)
  *H01R 13/74* (2006.01)

(52) U.S. Cl.
  CPC ....... *H01R 13/5202* (2013.01); *H01R 43/205* (2013.01); *H02K 5/225* (2013.01); *H05K 1/11* (2013.01); *H01R 12/52* (2013.01); *H01R 13/533* (2013.01); *H01R 13/745* (2013.01); *H01R 2201/26* (2013.01); *Y10T 29/49147* (2015.01)

(56) References Cited

U.S. PATENT DOCUMENTS

| | | | |
|---|---|---|---|
| 5,554,037 A * | 9/1996 | Uleski | 439/76.1 |
| 5,735,697 A | 4/1998 | Muzslay | |
| 5,934,913 A * | 8/1999 | Kodama | 439/76.1 |
| 5,967,802 A * | 10/1999 | Daly et al. | 439/76.1 |
| 6,155,856 A * | 12/2000 | Sanada | 439/76.1 |
| 6,869,293 B2 * | 3/2005 | Kamiya | 439/76.1 |
| 2003/0157844 A1 | 8/2003 | Kamiya | |
| 2011/0034073 A1 | 2/2011 | Umfahrer et al. | |

FOREIGN PATENT DOCUMENTS

| | | |
|---|---|---|
| DE | 197 19 238 C1 | 10/1998 |
| DE | 198 03 358 A1 | 8/1999 |
| JP | 8-17507 A | 1/1996 |
| JP | 2003-243087 A | 8/2003 |
| WO | 2009/130156 A1 | 10/2009 |

* cited by examiner

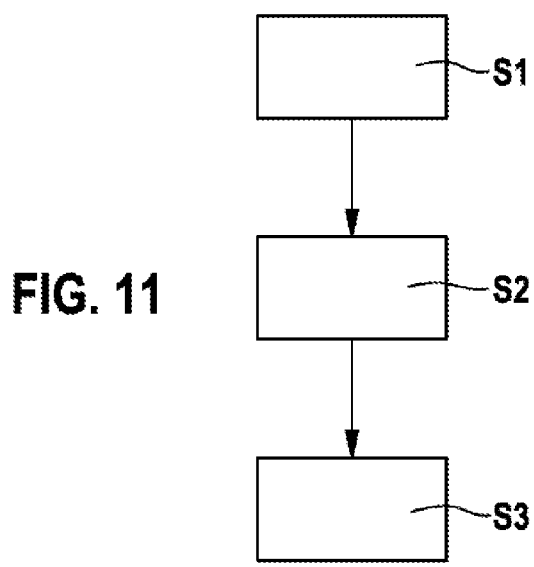

ELECTRICAL PLUG-TYPE CONNECTOR AND AN ASSOCIATED ARRANGEMENT COMPRISING A HOUSING

This application is a 35 U.S.C. § 371 National Stage Application of PCT/EP2012/072611, filed on Nov. 14, 2012, which claims the benefit of priority to Ser. No. DE 10 2011 089 081.5, filed on Dec. 19, 2011 in Germany, the disclosures of which are incorporated herein by reference in their entirety.

BACKGROUND

In automatic transmissions of modern motor vehicles, the transmission control modules are in many cases arranged within the automatic transmission. In order to electrically conductively connect these transmission control modules to electrical connection lines for voltage supply, to signal lines and to bus lines, electrical lines are guided from the transmission control module to an electrical plug-type connector, which is arranged in a through-hole in a transmission housing surrounding the automatic transmission. The transmission housing delimits an interior space filled with automatic transmission oil from an exterior space surrounding the automatic transmission. The electrical plug-type connector can be electrically contacted from the exterior space by means of an electrical mating plug-type connector. The electrical plug-type connector arranged in the through-hole is formed in such a way that no fluid can pass from the interior space to the exterior space. In this case, the plug housing is sealed on its outer wall with respect to the transmission housing, generally by means of an elastomer ring seal. Electrical plug-type contacts are generally arranged in the plug housing of the electrical plug-type connector and protrude from the exterior space into the interior space. These plug-type contacts are sealed with respect to the plug housing fabricated from plastic. This can be achieved for example in that the plug-type contacts have specifically shaped surface profiles, such as a fir-tree profile, in the region with which the plug-type contacts are connected to the plug housing. It is also known to form the seal using O-rings, which are fitted to each plug-type contact. Furthermore, seals by casting, for example with polyurethane, epoxy resin, silicones or similar materials, are known.

It has been found however that, after a few temperature changes within the automatic transmission, wherein the temperature fluctuations may be between −40° C. and +150° C., the adhesion or press-fit between the plug-type contact and the plug housing can loosen. Casting compounds are also susceptible to crack formations or are not sufficiently resistant to automatic transmission oils. This leads to leaks in so far as fluid can now pass from the interior space along the plug-type contacts through the plug housing into the exterior space.

SUMMARY

There may be a need to provide an electrical plug-type connector for a through-hole in a housing, wherein the housing separates, in a fluid-tight manner, an interior space filled with fluid from an exterior space, wherein fluid is reliably prevented from passing from the interior space along the plug-type contacts thereof into the exterior space.

The need can be satisfied by the subjects of the description below. Further advantageous embodiments of the disclosure will emerge from the subjects of the description below.

In accordance with a first exemplary embodiment of the disclosure an electrical plug-type connector consisting of electrically non-conductive material comprising a plug housing with an inner wall and at least one plug-type contact is provided. The inner wall delimits a first space. The plug-type contact has a first end, which can be contacted by a mating plug-type contact, and a second end, which is opposite the first end. The second end is connected to a printed circuit board by means of solder. The plug housing is moved from the first end in the direction of the second end via the at least one plug-type contact in the axial direction into a predetermined position. In the predetermined position the plug-type contact is devoid of a force-fitting connection transversely to the axial direction. In the predetermined position the printed circuit board is fixedly connected to the plug housing. In the predetermined position the first end protrudes into the first space.

A soldering point between the plug-type contact and the printed circuit board and the formation of a solder meniscus, in a professional embodiment, is fluid-tight in particular with respect to automatic transmission oil. Therefore, it is impossible for fluid to pass through the soldering point from a first side of the printed circuit board to a second side of a printed circuit board opposite the first side. The printed circuit board is accordingly fluid-tight, and it is therefore likewise impossible for fluid to pass through the printed circuit board. The fixed connection between plug housing and printed circuit board can be formed in such a way that no fluid can pass between the plug housing and the printed circuit board in order to pass from there into an exterior space. Here, a sealing element for example can be arranged between the printed circuit board and a housing, which surrounds the plug-type connector and can be formed for example as an automatic transmission housing, in such a way that no fluid can travel past the sealing element to the fixed connection between the printed circuit board and plug housing. The fixed connection can be produced for example by adhesive bonding. The fixed connection may also be fluid-tight. A fluid-tight connection between the plug housing and printed circuit board can likewise be achieved for example by an adhesive bonding or by an insertion of a sealing element. Of course, the plug housing may also be fluid-tight. The printed circuit board can be rigid or flexible. If the printed circuit board is flexible, a support element is generally fixedly connected on a side of the printed circuit board facing away from the plug housing to the flexible printed circuit board. If the printed circuit board is rigid, the printed circuit board is then produced from glass-fiber-reinforced resin, wherein the resin may be epoxy resin, phenol resin or polyester resin for example. The printed circuit board generally has a quality of FR4 or above. The strength of the plug-type contact against an axial movement, that is to say a movement in the direction of longitudinal extension of the plug-type contact, is produced by the integrally bonded connection between the plug-type contact and the printed circuit board. If the printed circuit board therefore were absent, the plug-type contact would be axially movable relative to the plug housing. Since the printed circuit board may be fitted first with the plug-type contacts before the printed circuit board and the plug housing are joined, the plug-type contacts may be non-detachably connected on the first side of the printed circuit board, for example by means of SMT (surface-mounting technology), wherein the first side faces the plug housing. The stability of the plug-type contact in the printed circuit board can advantageously be increased if the second end of the plug-type contact is arranged in a recess, such as a blind bore, formed in the printed circuit board on the first side. The stability can advantageously be increased further by passing the second end from the first side of the printed circuit board through a through-hole in the printed circuit board, wherein the second end protrudes beyond a second side opposite the first side. Here, the plug-type contact can be connected in an integrally bonded manner to the printed circuit board by means of a selective soldering process, in such a way that a solder meniscus forms both on the first side and on the second side of the printed circuit board. Due to the integrally bonded soldered connection, it is therefore impossible for fluid to pass from the interior space along the second end of the plug-type contact from the second side to the first side of the printed circuit board and vice versa. The plug-type contact plugged through the printed circuit board can be soldered on the first side or also on the second side of the printed circuit board. The printed circuit board may also be soldered in a reflow furnace. The plug housing itself does not have to be fabricated from a plastic which is resistant to the reflow soldering process, since the printed circuit board is non-detachably connected in a fluid-tight manner to the plug housing only after the reflow soldering.

In accordance with a further exemplary embodiment of the disclosure the plug-type contact to the plug housing is not fluid-tight.

It is therefore possible to dispense with the introduction of sealing compounds, such as casting compounds or sealants, for example O-rings, between the plug-type contact and plug housing. The plug-type contact may even be distanced from the plug housing.

In accordance with a further exemplary embodiment of the disclosure a bridge element is fixedly connected to the inner wall of the electrical plug-type connector. The bridge element has at least one opening extending in a direction of longitudinal extension of the plug-type contact. The at least one plug-type contact is guided through the at least one opening. The at least one plug-type contact is supported by the bridge element exclusively in the radial direction.

Here, the plug-type contact may be loose in the bridge element, such that a fluid can pass from the exterior space along the first end through the opening along the plug-type contact to the printed circuit board. The printed circuit board with the soldered-in plug-type contact prevents a further diffusion of said fluid however. So that the solder meniscus facing the plug housing on the first side of the printed circuit board advantageously does not collide with the bridge element, the first space can be divided by the bridge element into a second space and a third space, wherein the first end of the plug-type contact is arranged in the second space. The third space can be formed in such a way that the solder meniscus protruding into the third space is obstructed neither by the plug housing nor by the bridge element spaced from the printed circuit board. The bridge element supports the at least one plug-type contact against a lateral yielding or deformation due to a plugging of an electrical mating plug-type connector comprising a mating plug housing fitted with mating-type contacts onto the electrical plug-type connector. If the plug-type contact were not connected to the printed circuit board, it could be moved in the axial direction, that is to say in the direction of longitudinal extension of the plug-type contact. In contrast to this, the plug-type contacts of electrical plug-type connectors according to the prior art, which may be configured to be soldered into printed circuit boards, are non-detachably connected to the associated plug housing. The radial direction extends transversely to the axial direction.

In accordance with a further exemplary embodiment of the disclosure, the plug-type contact of the electrical plug-type connector has a thickened portion. The thickened portion is supported on the bridge element in such a way that a movement in translation of the plug-type contact in the direction of the first end is prevented.

Due to the thickened portion, when the electrical mating plug-type connector is removed from the electrical plug-type connector, the forces occurring during this process can be kept away from the printed circuit board. The thickened portion on the plug-type contact generally extends in the third space of the plug housing.

In accordance with a further exemplary embodiment of the disclosure an electrical line is non-detachably connected on the printed circuit board for an electrically conductive connection to the at least one plug-type contact.

Here, the electrical line for example may be connected on an SMD (surface-mounted device) wire clip. The electrical line may also be a strip which is fabricated from a flexible printed circuit board. The electrical line may be electrically conductively connected on the rigid printed circuit board, for example by soldering or welding. If the plug-type contact is fastened to a flexible printed circuit board, the flexible printed circuit board may also be lengthened, such that an additional electrical line can be spared. The rigid printed circuit board may also have a conductive track between the first side and the second side in the direction of longitudinal extension of the printed circuit board, said conductive track electrically conductively connecting the electrical line to the plug-type contact. For example, the line or contact elements thereof, such as the SMD wire clip, may therefore be arranged in the vicinity of the edge of the printed circuit board. The line is generally electrically conductively connected on the second side of the printed circuit board opposite the plug housing.

In accordance with a further exemplary embodiment of the disclosure an electrical line is detachably connected electrically conductively on the at least one plug-type contact.

Here, the line is contacted directly on the plug-type contact. This can be achieved for example by welding or soldering. Here, the second end protruding from the second side of the printed circuit board may also be lengthened, such that, as the line is connected on the plug-type contact, the heat produced during the welding or soldering process cannot damage the soldering point between the plug-type contact and the printed circuit board. Of course, it is also possible to dispense with a lengthening of this type if the line is electrically conductively connected on the plug-type contact for example by crimping, that is to say without the influence of heat.

In accordance with a further exemplary embodiment of the disclosure the plug housing has an outer wall opposite the inner wall. A receiving element for receiving a peripheral first sealing element is formed on the outer wall.

The electrical plug-type connector is usually arranged in a through-hole in a fluid-tight housing separating the interior space from an exterior space in a fluid-tight manner. The sealing element may be part of the plug housing and in this case may seal the plug housing with respect to the housing, for example the automatic transmission housing, such that no fluid can pass from the interior space between the plug housing and the housing of the interior space into the exterior space.

The receiving element for example may be configured to receive a flat seal or a round seal.

In accordance with a further exemplary embodiment of the disclosure the receiving element is formed as a U-shaped groove with a first branch, a second branch opposite the first branch and a connecting piece connecting the two branches non-detachably. The first branch and the connecting piece are formed by the outer wall. The second branch is formed by the printed circuit board.

The sealing element can thus be arranged for example in the form of an O-ring on the plug housing, such that the sealing element bears against the first branch and/or against the connecting piece. The sealing element can then be fixed by means of the printed circuit board, which is non-detachably connected on the plug housing, wherein the second branch is formed on the printed circuit board. The sealing element therefore is not drawn over one of the two branches in order to be arranged between the two branches. In particular, drawing the sealing element over one of the branches in this way may lead to an irreversible stretching of the sealing element and therefore to damage.

In accordance with a further exemplary embodiment of the disclosure the printed circuit board is arranged within the first space, wherein the printed circuit board is connected in a fluid-tight manner to the inner wall.

In this embodiment the printed circuit board may be embedded in the plug housing. Retaining elements may also be provided on the inner wall, which prevent the printed circuit board from detaching from the interior space in a translatory direction along the direction of longitudinal extension of the plug-type contacts. If the plug housing is fabricated from plastic, these retaining elements can be produced for example by hot caulking. The retaining elements can also be produced by adhesively bonding a plastic ring or by welding in a plastic ring. For example, a peripheral groove, in which a snap ring can be placed, which fixes the printed circuit board in the interior space, can also be incorporated on the inner wall.

In accordance with a further exemplary embodiment of the disclosure a peripheral second sealing element is arranged between the printed circuit board and a bridge element.

The printed circuit board can be arranged in the third space as a result of the bridge element. The sealing element may prevent a fluid, which may be seeping through between the printed circuit board and the inner wall of the third space, from passing to the region of the plug-type contact guided through the base element.

In accordance with a further exemplary embodiment of the disclosure the first and/or the second sealing element is an O-ring.

In accordance with a further exemplary embodiment of the disclosure an arrangement with a housing and an electrical plug-type connector as described in the above is provided. The housing separates an interior space from an exterior space surrounding the housing. The housing has a through-hole. The electrical plug-type connector is arranged in the through-hole. The housing and the plug-type connector are interconnected in a fluid-tight manner by the first sealing element running around in the receiving element of the outer wall.

As a result, it is impossible for fluid present in the interior space of the housing to reach the outer wall of the electrical plug-type connector or to pass along the through-hole to the exterior space.

In accordance with a further exemplary embodiment of the disclosure the housing has a collar. A technical spring is arranged in the interior space of the housing. The technical spring and the plug housing of the electrical plug-type connector cooperate in such a way that a first branch of the receiving element is pressed against the collar.

The technical spring may be a leaf spring, a leg spring or a compression spring, for example. The technical spring ensures that the plug housing is always pressed against the collar with practically constant force. Relative movements of the components due to temperature influences can therefore be equalized.

In accordance with a further exemplary embodiment of the disclosure the technical spring is formed as a leaf spring having a first end and a second end opposite the first end. The first end is non-detachably connected to the housing. The second end exerts a force on the electrical plug-type connector.

In accordance with a further exemplary embodiment of the disclosure the housing is an automatic transmission housing for a motor vehicle.

The fluid present in the interior space is therefore generally automatic transmission oil.

In accordance with a further exemplary embodiment of the disclosure an automatic transmission for a motor vehicle comprising an electrical plug-type connector as described in the above is provided.

In accordance with a further exemplary embodiment of the disclosure a method for producing an electrical plug-type connector consisting of electrically non-conductive material comprising a plug housing with an inner wall and at least one plug-type contact is provided. The inner wall delimits a first space. The plug-type contact has a first end, which can be contacted by a mating plug-type contact, and a second end, which is opposite the first end. The method comprises the following steps: connecting the second end to a printed circuit board by means of solder; moving the plug housing from the first end in the direction of the second end via the at least one plug-type contact in the axial direction into a predetermined position; connecting the printed circuit board to the plug housing in a fluid-tight manner in the predetermined position, wherein the plug-type contact in the predetermined position is devoid of a force-fitting connection transversely to the axial direction, wherein the first end protrudes into the first space in the predetermined position.

It is noted that concepts concerning the disclosure are described herein in conjunction with an electrical plug-type connector, an arrangement comprising a housing and an electrical plug-type connector, an automatic transmission and a method for producing an electrical plug-type connector. It is clear here to a person skilled in the art that the individual described features can be combined with one another in various ways in order to thus also arrive at other embodiments of the disclosure.

BRIEF DESCRIPTION OF THE DRAWINGS

Embodiments of the disclosure will be described hereinafter with reference to the accompanying figures. The figures are merely schematic and are not true to scale.

FIG. 11 shows a block diagram of a method for producing the electrical plug-type connector.

DETAILED DESCRIPTION

Figure 1:
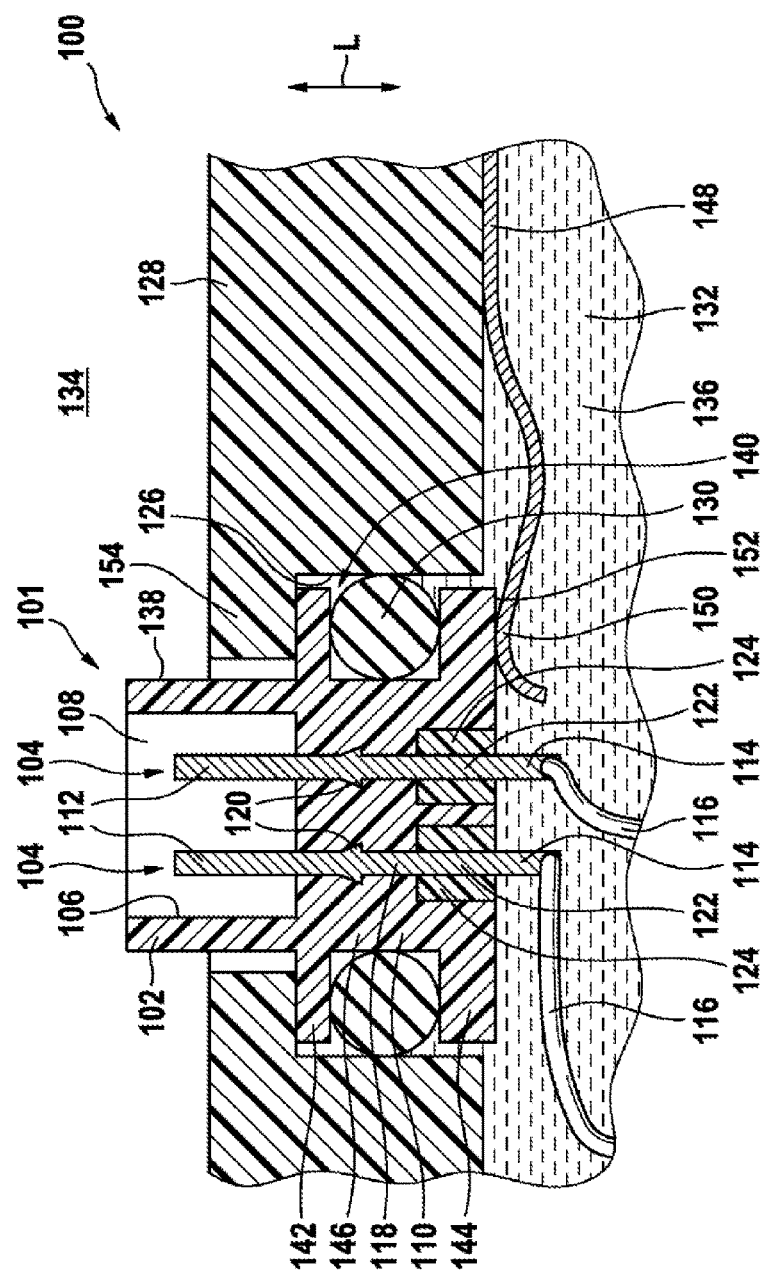
FIG. 1 shows a longitudinal section of an arrangement comprising a housing and an electrical plug-type connector according to the prior art, which is arranged in a through-hole in the housing.

FIG. 1 shows an arrangement 100 comprising a housing 128 and comprising an electrical plug-type connector 101 according to the prior art. The electrical plug-type connector 101 is fabricated from electrically non-conductive material and has a plug housing 102 and at least one plug-type contact 104. The plug housing 102 has a cylindrical inner wall 106 and a bridge element 110, wherein a first space 108 is delimited by the cylindrical inner wall 106 and the bridge element 110. The plug-type contact 104 has a first end 112, which can be contacted by a mating plug-type contact, and a second end 114, which is opposite the first end 112. The second end 114 is electrically conductively and non-detachably connected to a line 116. The first end 112 protrudes into the first space 108. A first central part 118, which is connected in a form-fitting manner to the bridge element 110, is located between the first end 112 and the second end 114. For this purpose, the first central part 118 is formed as a fir-tree profile 120. Adjacently to the first central part 118, a second central part 112, which is sealed by means of a casting compound 124 with respect to the plug housing 102, extends in the direction of the second end 114. The electrical plug-type connector 101 is arranged in a though-hole 126 in the housing 128. The housing 128 separates an interior space 132 in a fluid-tight manner from an exterior space 134, wherein fluid 136, which for example may be automatic transmission oil, is located in the interior space 132. An outer wall 138 is formed opposite the inner wall 106 of the plug housing 102. The outer wall 138 has a U-shaped seat 140 comprising a first branch 142, a second branch 144 and a connecting piece 146 fixedly connecting the first branch 142 and the second branch 144. A first sealing element 130 formed as an O-ring is arranged between the first branch 142 and the second branch 144. Due to the first sealing element 130, the fluid 136 is prevented from being able to travel from the interior space 132 past the outer wall 138 of the plug housing 102 and/or past the through-hole 126 to the exterior space 134 in a proven manner. Further, a technical spring 148, which is formed as a leaf spring, is supported on the housing 128. The leaf spring has a free end 150, which presses against an underside 152 of the plug housing 102 and here presses the first end 112 against a collar 154 formed in the housing 128.

It has been found that, with an embodiment of this type of the electrical plug-type connector 101, the casting compound 124 may become brittle due to temperature fluctuations from −40° C. to +150° C. it has further been found that the initially fluid-tight connection between the first central part 118 and the plug housing 102, or the bridge element 110, loosens, such that the fluid 136 provided in the interior space 132 passes along the plug-type contact 104 in a direction of longitudinal extension L of the plug-type contact 104 from the second end 114 via the second central part 112 and further via the first central part 118 into the first space 108 and therefore passes into the exterior space 134.

Figure 2:
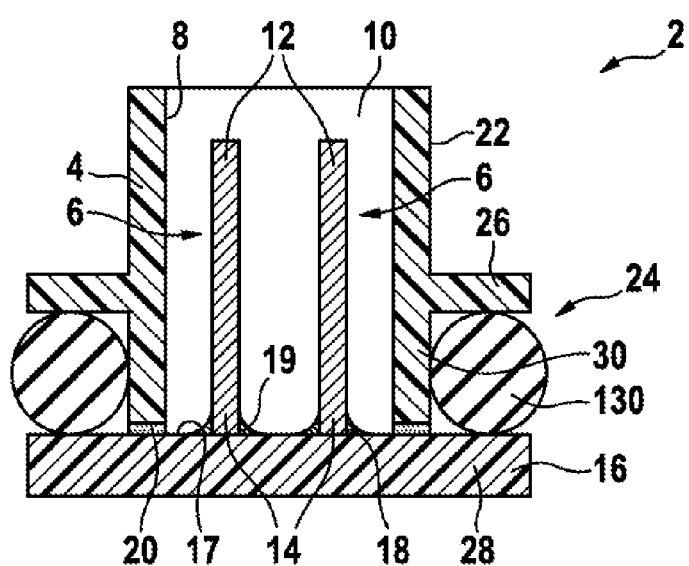
FIG. 2 shows a longitudinal section of a first variant of an electrical plug-type connector.

FIG. 2 shows an electrical plug-type connector 2 consisting of electrically non-conductive material comprising a plug housing 4 and two plug-type contacts 6. The plug housing 4 has a cylindrical inner wall 8, which delimits a first space 10. Each plug-type contact has a first end 12, which can be contacted by a mating plug-type contact, and a second end 14, which is opposite the first end 12. The second end 14 is butted against a first side 17 of a rigid printed circuit board 16 and is connected in an integrally bonded manner to the printed circuit board 16 by means of solder 18. The first side 17 faces the plug housing 4. The plug-type contact 6 is connected in an integrally bonded manner to the printed circuit board 16 with formation of a solder meniscus 19. The plug housing 4 is non-detachably connected in a fluid-tight manner to the first side 17 of the printed circuit board 16 by means of an adhesive bond 20. Opposite the inner wall 8, the plug housing 4 has an outer wall 22, on which a U-shaped receiving element 24 is formed in conjunction with the printed circuit board 16. The receiving element 24 is formed by a first branch 26, a second branch 28 opposite the first branch 26, and a centerpiece 30 fixedly connecting the first branch 26 and the second branch 28. Here, the first branch 26 and the centerpiece 30 are formed in the outer wall 22 of the plug housing 4, whereas the second branch 28 is formed in the printed circuit board 16. The first sealing element 130 already known from FIG. 1 is arranged in the receiving element 24. In the embodiment illustrated here the first sealing element 130 can be mounted on the plug housing 4 before the printed circuit board 16 is fixedly connected to the plug housing 4. The first sealing element 130 is therefore prevented from being stretched and would otherwise have to be drawn over the first branch 26 or the second branch 28 in order to be arranged in its receiving element 24.

Figure 3:
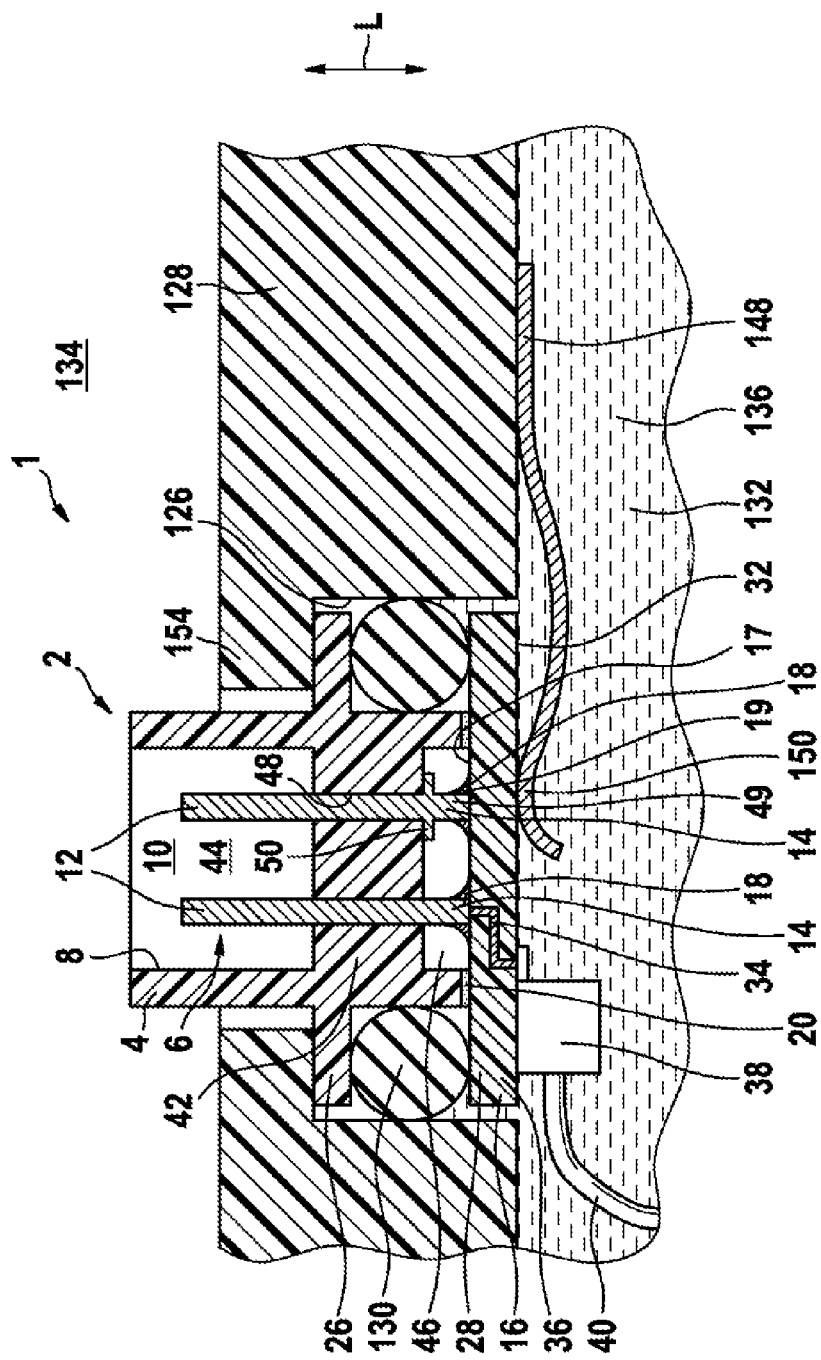
FIG. 3 shows a longitudinal section of the arrangement known from FIG. 2 comprising an electrical plug-type connector with an electrical line, which is mounted in the through-hole in the housing.

FIG. 3 shows an arrangement 1 comprising the housing 128 and comprising the electrical plug-type connector 2 known from FIG. 2, wherein the electrical plug-type connector 2 is arranged in the through-hole 126 in the housing 128, said through-hole being known from FIG. 1. A second side 32 extends opposite the first side 17 of the rigid printed circuit board 16. A conductive track 34 extends between the first side 17 and the second side 32, substantially transversely to the direction of longitudinal extension L of the plug-type contact 6. The conductive track 34 electrically conductively connects the plug-type contact 6 to a SMD (surface-mounting device) wire clip 38 fixedly connected on an edge region 36 of the printed circuit board 16 electrically conductively. An electrical line is non-detachably connected electrically conductively on the SMD wire clip 38. A bridge element extending substantially transversely to the direction of longitudinal extension L of the plug-type contact 6 is non-detachably connected non-detachably on the inner wall 8 of the plug housing 4. The bridge element 42 in the present exemplary embodiment divides the first space 10 into a second space 44 and a third space 46. Here, the first end 12 of the plug-type contact 6 extends into the second space 44. The third space 46 is formed in such a way that neither the inner wall 8 nor the bridge element 42 contacts the solder menisci 19. The bridge element 42 has an opening 48, through which the plug-type contact 6 is guided. The bridge element 42, if the plug-type contacts 6 are contacted with mating plug-type contacts (not illustrated here), prevents the plug-type contacts 6 from yielding or deforming laterally, that is to say transversely to the direction of longitudinal extension L of the plug-type contacts 6. The plug-type contacts 6 are thus supported in the radial direction by the bridge element 42, whereas the plug-type contacts 6 may be loose in the translatory direction, that is to say along their direction of longitudinal extension L. As can be seen at the plug-type contact 6 illustrated to the right, a thickened portion 50 can be formed on a sub-area 49 of the plug-type contact 6 extending in the third space 46 and is supported on the bridge element 42. A force applied to the plug-type contact 6 when removing the mating plug-type contact from the plug-type contact 6 is therefore prevented from having to be taken up by the solder 18 or the solder meniscus 19. It can also be seen, since the plug housing 4 is connected in a fluid-tight manner to the printed circuit board 16 by means of an adhesive bond 20, that no fluid 136 can pass from the interior space 132 between the printed circuit board 16 and the plug housing 4 to the plug-type contact 6. The electrical plug-type connector 2 is fixed in the through-hole 126 since the first branch 26 is pressed against the collar 154. Here, the free end 150 of the technical spring 148 illustrated as a leaf spring exerts a force against the second side 32 of the rigid printed circuit board 16.

Figure 4:
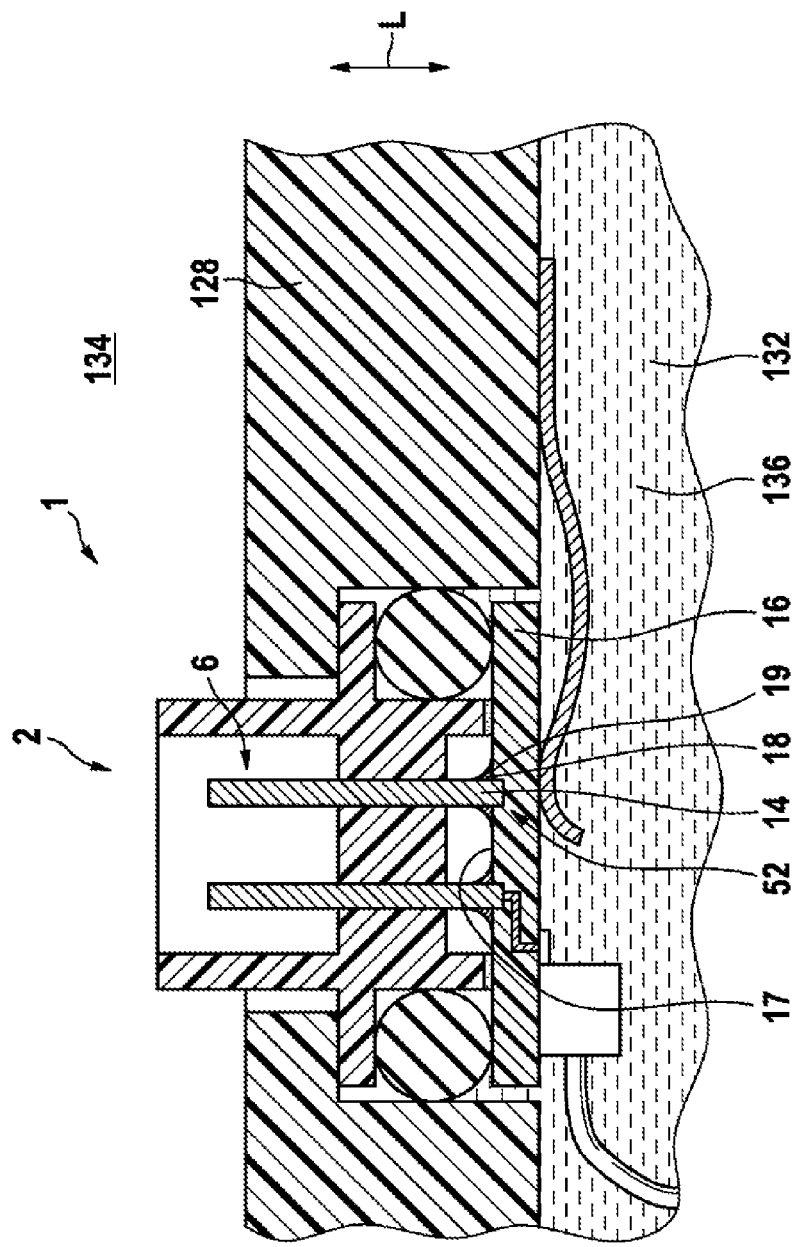
FIG. 4 shows a longitudinal section of the arrangement known from FIG. 3 comprising an electrical plug-type connector, in which the plug-type contacts of said plug-type connector are arranged in recesses in a rigid printed circuit board.

FIG. 4 differs from the illustration of the arrangement 1 known from FIG. 3 in that a recess 52 in the form of a blind bore, into which the second end 14 of the plug-type contact 6 of the electrical plug-type connector 2 protrudes, is formed in the printed circuit board 16 on the first side 17. The plug-type contact 6 is thus connected in a more stable manner to the printed circuit board 16 than is the case in FIG. 3.

Figure 5:
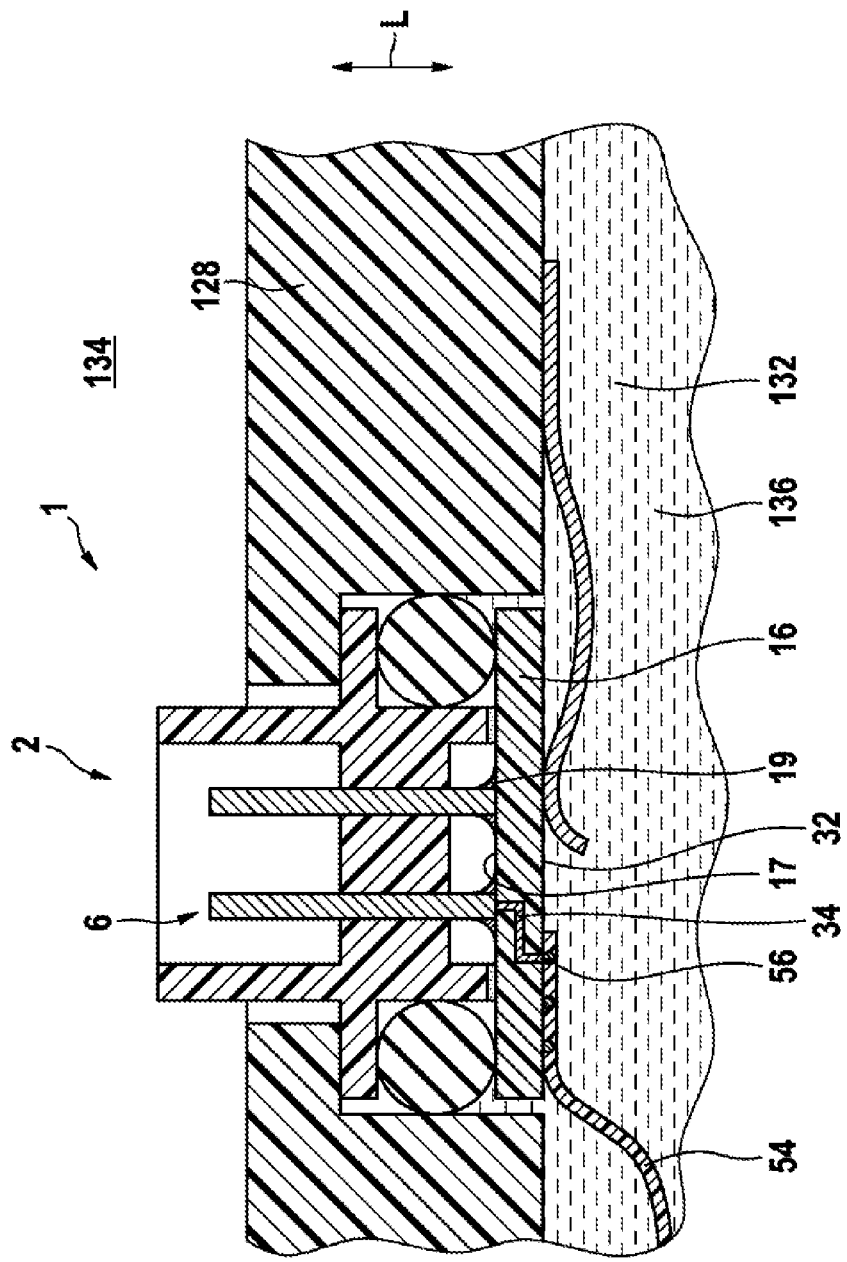
FIG. 5 shows a longitudinal section of the arrangement known from FIG. 3 comprising an electrical plug-type connector, in which the electrical line is replaced by a flexible printed circuit board.

FIG. 5 shows the arrangement 1 known from FIG. 3. The electrical plug-type connector 2 illustrated here differs from that illustrated in FIG. 3 in that the SMD wire clip 38 with the associated line 40 illustrated in FIG. 3 is replaced by a flexible printed circuit board strip 54 comprising an inner conductive track 56. Here, the inner conductive track is fixedly connected electrically conductively to the conductive track 34 and therefore to the plug-type contact 6. This is achieved by welding in the exemplary embodiment illustrated here.

Figure 6:
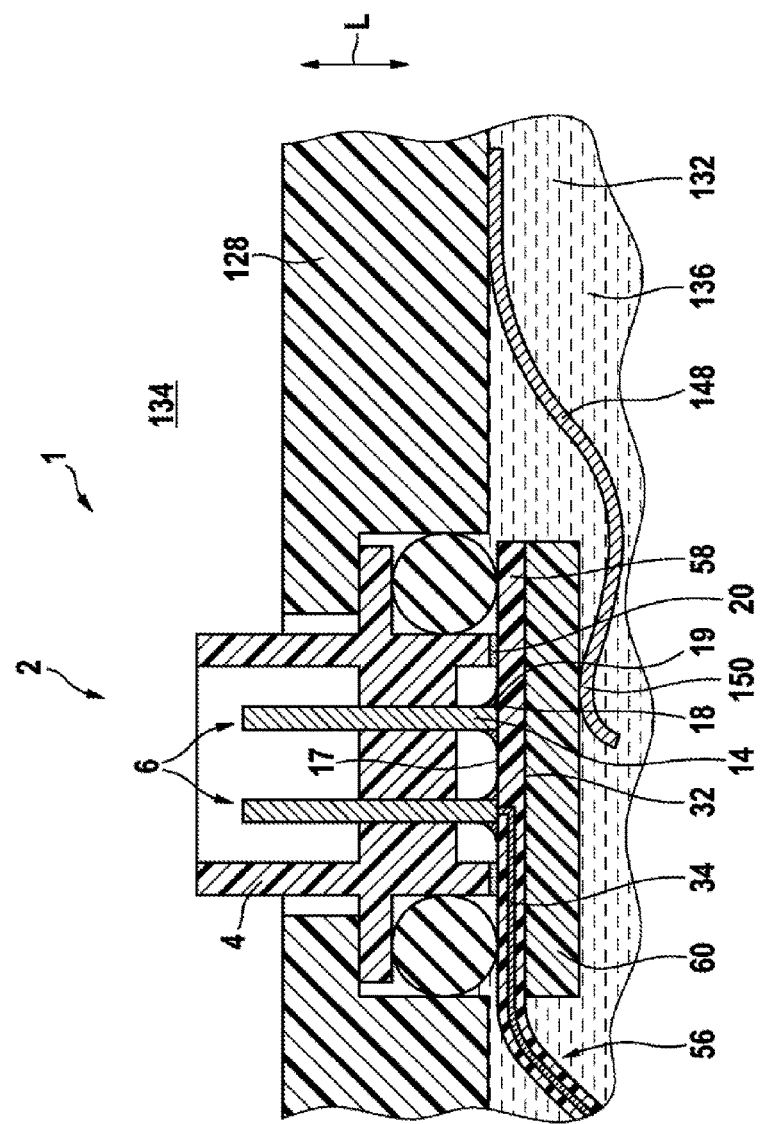
FIG. 6 show a longitudinal section of the arrangement known from FIG. 3 comprising an electrical plug-type connector, in which the rigid printed circuit board is replaced by a flexible printed circuit board.

FIG. 6 shows the arrangement 1 known from FIG. 3, wherein, in the illustration selected here, the rigid printed circuit board 16 has been replaced by a flexible printed circuit board 58. Here, the conductive track 56 inside the flexible printed circuit board 58 is non-detachably connected electrically conductively to the corresponding plug-type contact 6. To stabilize the flexible printed circuit board 58 in the region of the plug housing 4, the second side 32, which is arranged opposite the plug housing 4, is non-detachably connected to a support element 60. Here, the free end 150 of the technical spring 148 presses against the support element 60.

Figure 7:
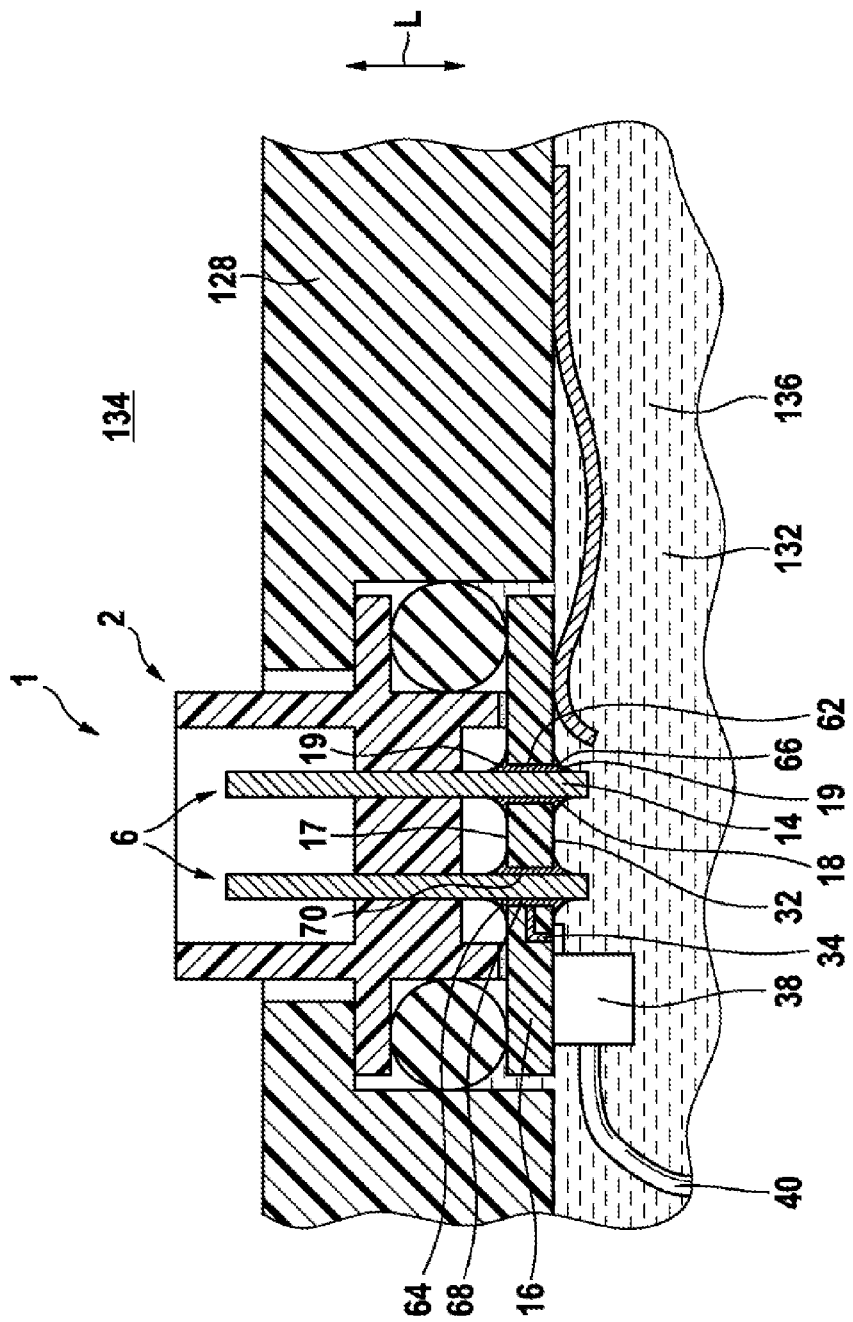
FIG. 7 shows a longitudinal section of the arrangement known from FIG. 3 comprising an electrical plug-type connector, in which the plug-type contacts protrude through a rigid printed circuit board.

FIG. 7 shows the arrangement 1 known from FIG. 3, wherein, in contrast to the illustration in FIG. 3, the printed circuit board 16 of the electrical plug-type connector 2 has a through-hole 62 extending from the first side 17 to the second side 32 along the direction of longitudinal extension L of the plug-type contact 6. The second end 14 of the plug-type contact 16 is guided through the through-hole 62, such that the plug-type contact 6 projects into the interior space 132 on the second side 32 of the printed circuit board 16. The through-hole 62 is surrounded annularly on the first side 17 by a first soldering eye 64 and on the second side 32 by a second soldering eye 66. Here, the two soldering eyes 64, 66 are connected non-detachably to the printed circuit board 16. Furthermore, the first soldering eye 64 and the second soldering eye 66 are electrically conductively interconnected by means of a throughplating 68. The throughplating 68 forms an inner wall 70, which constitutes the through-hole 62. A solder meniscus 19 is formed both on the first side 17 and on the second side 32 as a result of the integrally bonded connection between the second end 14 and the printed circuit board 16 by means of the solder 18. Here, the soldering process may have been performed both on the first side 17 and on the second side 32. Due to the capillary effect, the first end 14 of the plug-type contact 6 is also connected in an integrally bonded manner to the throughplating 68. Since the solder 20 is fluid-tight with respect to the fluid 136, no fluid 136 can pass along the plug-type contact 6 from the second side 32 of the printed circuit board 16 through the through-hole 62 to the first side 17 along the plug-type contact 6.

Figure 8:
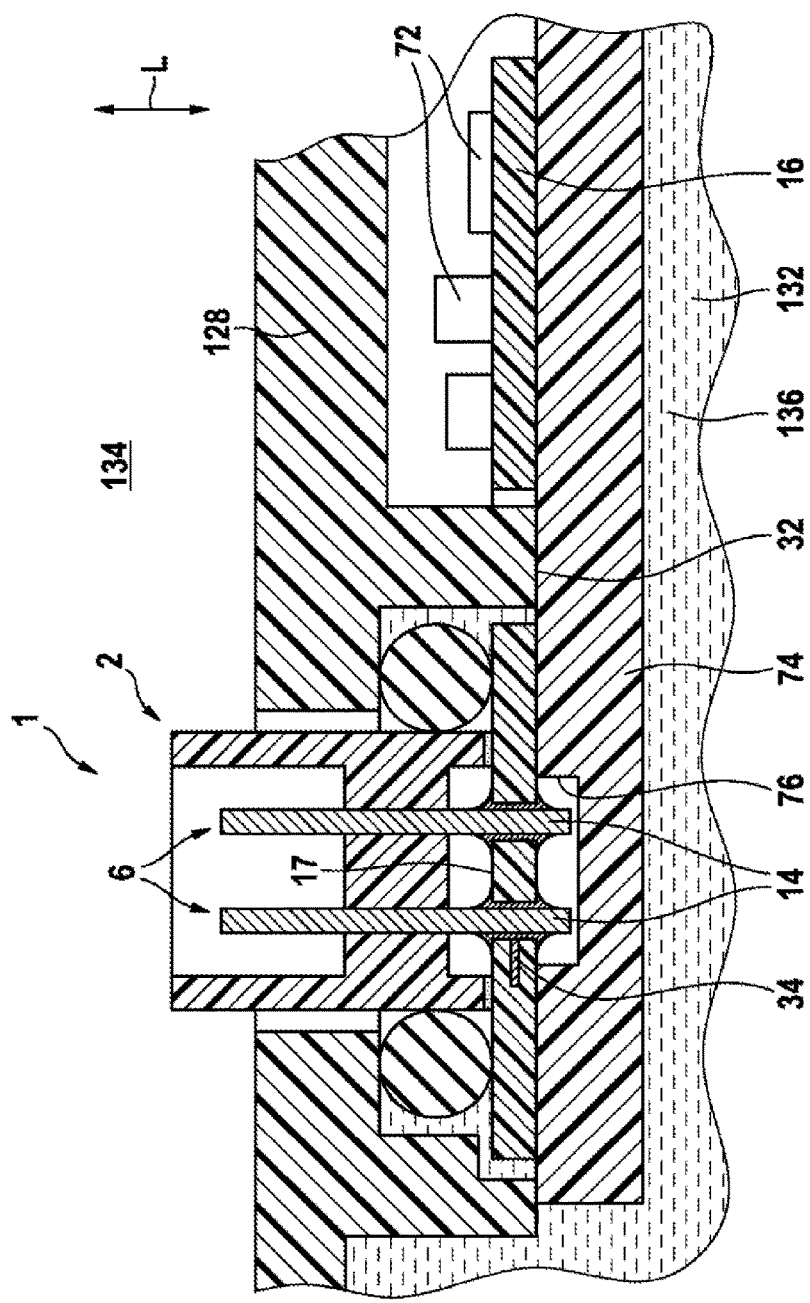
FIG. 8 shows a longitudinal section of the arrangement known from FIG. 7 comprising an electrical plug-type connector, in which the printed circuit board for receiving further electrical components is enlarged.

FIG. 8 shows the arrangement 1 known from FIG. 7, in which the printed circuit board 16 has been enlarged compared with the illustration selected in FIG. 7 in order to electrically conductively connect further electrical components 72 to the plug-type contact 6. Here, the printed circuit board 16 is non-detachably connected on its second side 32 to a carrier plate 74. Furthermore, the carrier plate 74 has a recess 76, into which the second ends 14 protruding beyond the second side 32 protrude, without contacting the carrier plate however. The electrically conductive connection between the further electrical components 72, which may also be formed as a control module, and the plug-type contact 6 is produced by the conductive track 34. Accordingly, the SMD wire clip 38 with the associated cable 40 illustrated in FIG. 7 is omitted.

Figure 9:
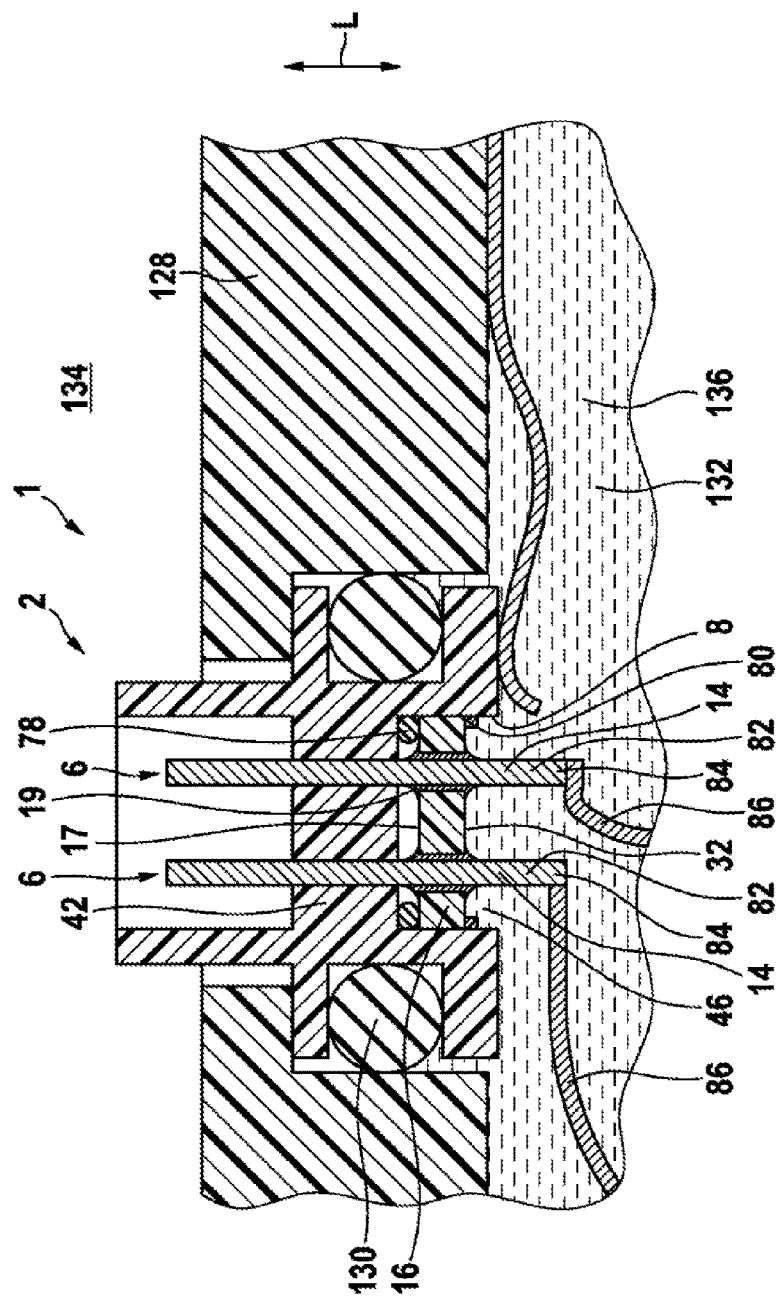
FIG. 9 shows a longitudinal section of the arrangement known from FIG. 1 with a second variant of an electrical plug-type connector, in which the rigid printed circuit board is arranged in a space delimited by an inner wall.

FIG. 9 shows the arrangement known from FIG. 3, in which the rigid printed circuit board 16 is arranged within the third space 46 of the electrical plug-type connector 2. So that no fluid 136 can pass from the interior space 132 between the printed circuit board 16 and the inner wall 8 to the first end 12 of the plug-type contact 6, a second sealing element 78 is arranged between the first side 17 of the printed circuit board and the bridge element 42. So that the printed circuit board 16 rests against the sealing element 78, the printed circuit board 16 is fixed on the second side 32 by means of a plastic ring 80 adhesively bonded to the inner wall 8. Furthermore, the plug-type contact 6 is lengthened by means of an extension 82 into the interior space 132. Here, the extension 82 has a head element 84, wherein the head element 84 is non-detachably connected electrically conductively to an electrical line 86 by means of a welding process. The extension 82 means that the heat produced during the welding process does not damage the integrally bonded connection between the second end 14 and the printed circuit board 16.

Figure 10:
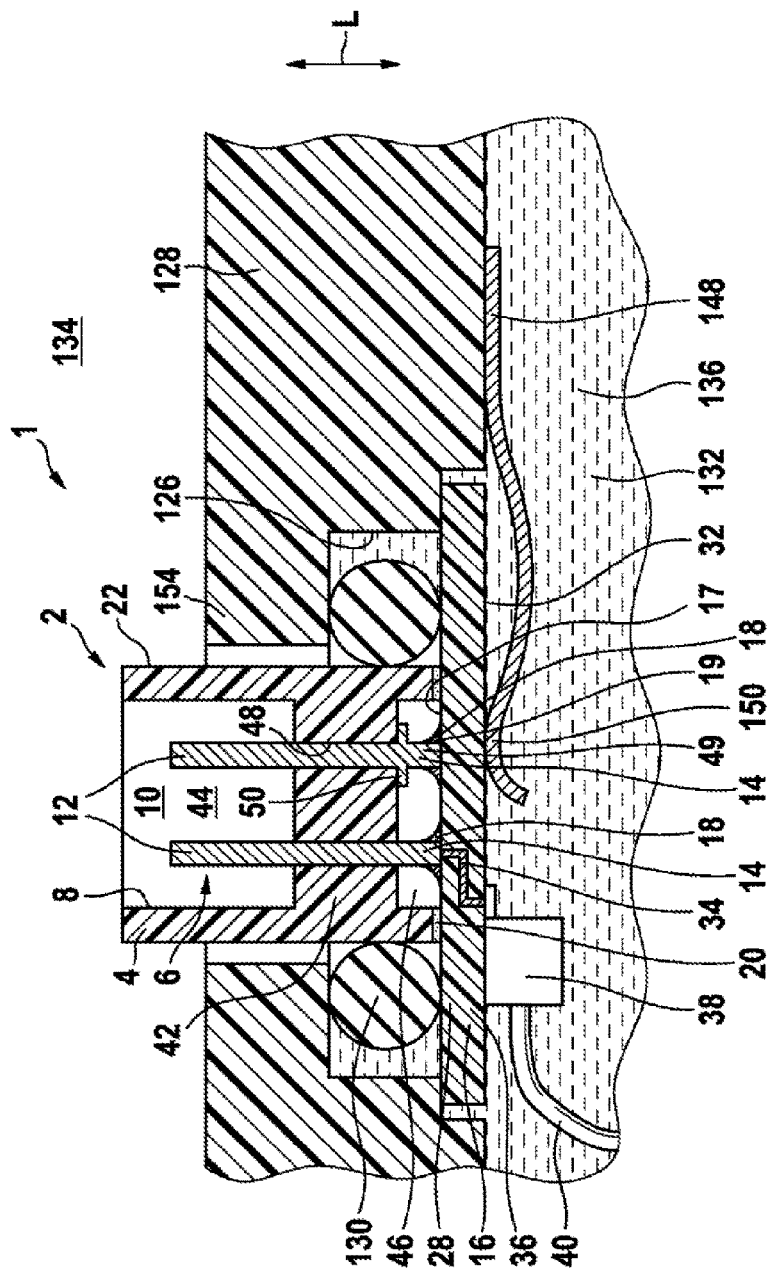
FIG. 10 shows the arrangement known from FIG. 3, in which a sealing element seat has been formed in such a way that a connection between a plug housing and the printed circuit board is not fluid-tight.

FIG. 10 shows the illustration known from FIG. 3. In contrast to the illustration in FIG. 3, the first branch 26 is omitted from the shaping of the outer wall of the plug housing 4. The sealing element 130 formed as an O-ring therefore rests against the second branch 28 formed on the printed circuit board 16 and against the collar 154. It is therefore impossible for fluid 136 to travel from the interior space 132 past the sealing element 130 to the adhesive bond 20. The adhesive bond 20 is then accordingly formed merely fixedly, but not fluid-tight, in the exemplary embodiment illustrated here.

FIG. 11 shows a block diagram of a method for producing an electrical plug-type connector 2 consisting of electrically non-conductive material comprising a plug housing 4 and at least one plug-type contact 6. The plug housing 4 has a substantially cylindrical inner wall 8, wherein the inner wall 8 delimits a first space 10. The plug-type contact 6 has a first end 12, which can be contacted by a mating plug-type contact, and a second end 14, which is opposite the first end 12. The method has the following method steps: S1 constitutes connecting the second end 14 to a printed circuit board 16 by means of solder 20 in an integrally bonded manner. Method step S2 constitutes moving the plug housing 4 from the first end 12 in the direction of the second end 14 via the at least one plug-type contact 6 into a predetermined position. Method step S3 constitutes connecting the printed circuit board 16 in the predetermined position to the plug housing 4 in a fixed manner, wherein the first end 12 protrudes into the first space 10 in the predetermined position.

The invention claimed is:

1. An electrical plug-type connector consisting of electrically non-conductive material, the electrical plug-type connector comprising:
   a plug housing with an inner wall and at least one plug-type contact, the inner wall configured to delimit a first space, the plug-type contact having a first end portion, configured to be contacted by a mating plug-type contact, and a second end portion opposite the first end portion, wherein:
   the second end portion is connected to a printed circuit board by solder,
   the printed circuit board is fixedly connected to the plug housing in a predetermined position,
   the plug-type contact is devoid of a force-fitting connection transversely to the axial direction in the predetermined position,
   the first end portion protrudes into the first space in the predetermined position, and
   the printed circuit board is connected in a fluid-tight manner to the plug housing, wherein:
   the plug housing has an outer wall opposite the inner wall, and
   a receiving element configured to receive a peripheral first sealing element is formed on the outer wall.

2. The electrical plug-type connector as claimed in claim 1, further comprising an electrical line non-detachably connected on the printed circuit board for an electrically conductive connection to the at least one plug-type contact.

3. The electrical plug-type connector as claimed in claim 1, wherein:
   the plug-type contact extends completely through the printed circuit board; and
   an electrical line is non-detachably connected electrically conductively on a portion of the at least one plug-type contact that extends beyond the printed circuit board.

4. The electrical plug-type connector as claimed in claim 1, wherein a peripheral second sealing element is arranged between the printed circuit board and a bridge element.

5. The electrical plug-type connector as claimed in claim 1, wherein the electrical plug-type connector is included in an automatic transmission for a motor vehicle.

6. The electrical plug-type connector as claimed in claim 1, further comprising:
   a bridge element fixedly connected to the inner wall, wherein:
   the bridge element has at least one opening extending in a direction of longitudinal extension of the plug-type contact,
   the at least one plug-type contact is configured to be guided through the at least one opening, and
   the at least one plug-type contact is configured to be supported by the bridge element exclusively in a radial direction, wherein the printed circuit board forms at least a portion of a fluid barrier for the at least one opening.

7. The electrical plug-type connector as claimed in claim 6, wherein:
   the plug-type contact has a thickened portion,
   the thickened portion is configured to be supported on the bridge element such that a movement in translation of the plug-type contact in a direction of the first end portion is prevented.

8. An arrangement, comprising:
   a housing; and
   an electrical plug-type connector, including a plug housing with an inner wall, an outer wall, and at least one plug-type contact, the inner wall configured to delimit a first space opening to an interior space, the outer wall opposite the inner wall, the plug-type contact having a first end, configured to be contacted by a mating plug-type contact, and a second end opposite the first end, the second end connected to a printed circuit board by solder, wherein:
   the printed circuit board is fixedly connected to the plug housing in the predetermined position in a fluid-tight manner,
   the plug-type contact is devoid of a force-fitting connection transversely to the axial direction in the predetermined position,
   the first end protrudes into the first space in the predetermined position,
   the housing is configured to separate, in a fluid-tight manner, the interior space from an exterior space surrounding the housing,
   the printed circuit board is configured to separate, in a fluid-tight manner, the first space from the exterior space,
   the housing has a through-hole,
   the electrical plug-type connector is arranged in the through-hole, and
   the housing and the plug-type connector are interconnected in a fluid-tight manner by a first sealing element running around in a receiving element of the outer wall.

9. The arrangement as claimed in claim 8, wherein:
   the housing has a collar,
   a technical spring is arranged in the interior space, and
   the technical spring and the plug housing are configured to cooperate such that a first branch of the receiving element is pressed against the collar.

10. A method for producing an electrical plug-type connector consisting of electrically non-conductive material including a plug housing and at least one plug-type contact, the plug housing having a substantially cylindrical inner wall, the inner wall delimiting a first space, the plug-type contact having a first end, configured to be contacted by a mating plug-type contact, and a second end, opposite the first end, the method comprising:
  connecting the second end to a printed circuit board by solder;
  moving the plug housing from the first end in a direction of the second end via the at least one plug-type contact in an axial direction into a predetermined position; and
  connecting the printed circuit board to the plug housing in a fluid tight manner in the predetermined position;
  wherein the plug-type contact is devoid of a force-fitting connection transversely to the axial direction in the predetermined position, and
  wherein the first end protrudes into the first space in the predetermined position.

* * * * *